United States Patent [19]
Oizumi et al.

[11] Patent Number: 5,177,773
[45] Date of Patent: Jan. 5, 1993

[54] X-RAY MASK AND METHOD FOR PRODUCING SAME

[75] Inventors: Hiroaki Oizumi, Kokubunji; Kozo Mochiji, Hachioji; Shimpei Iijima, Akishima, all of Japan

[73] Assignee: Hitachi, Ltd., Tokyo, Japan

[21] Appl. No.: 674,406

[22] Filed: Mar. 25, 1991

[30] Foreign Application Priority Data

Mar. 26, 1990 [JP] Japan .................. 2-073324

[51] Int. Cl.$^5$ .............................. G21K 5/00
[52] U.S. Cl. ................................ 378/34; 378/35
[58] Field of Search .......................... 378/34, 35

[56] References Cited

U.S. PATENT DOCUMENTS 4,948,482  8/1990  Kobayashi et al. ............. 204/192.23

FOREIGN PATENT DOCUMENTS 54-53965  4/1979  Japan .

OTHER PUBLICATIONS

*Solid State Technology*, Sep. 1984, pp. 192-199, "Advances in X-ray Mask Technology", A. R. Shimkunas.
Vac. Sci. Technol., 21 (4), Nov./Dec. 1982, pp. 1017-1021; "Silicon Nitride Single-layer X-ray Mask", Misao Sekimoto etal.
J. Vac. Technol. B 6 (1), Jan./Feb. 1988, pp. 162-166. "Radiation Damage in Boron Nitride X-ray lithography masks", Paul King et al.
J. Vac. Sci. Technol. B 5 (1), Jan./Feb. 1987, pp. 257-261 "Radiation Damage effects in Boron Nitride Mask membranes subjected to X-ray exposures", W. A. Johnson et al.
J. Vac. Sci. Technol., B 6 (6), Nov./Dec. 1988, pp. 2190-2195 "Quantitative in situ characterization of X-ray mask distortions", G. M. Wells et al.
1st Microprocessor Conference, 1988, A-7-3, pp. 78-79.
Journal of Electrochemical Society, vol. 123, No. 5, pp. 723-728. May 1976.

*Primary Examiner*—David P. Porta
*Attorney, Agent, or Firm*—Fay, Sharpe, Beall, Fagan, Minnich & McKee

[57] ABSTRACT

An X-ray mask comprises an absorber pattern composed of a material capable of absorbing X-ray, a mask substrate for supporting the absorber pattern, composed of a material capable of transmitting X-ray, and a support frame for supporting the mask substrate, wherein the mask substrate is composed of a mask substrate material whose impurity content is suppressed to reduce positional distortions generated by X-ray radiation. Generation of positional distortions by X-ray exposure is inhibited and an arrangement of mask pattern can be ensured with a high precision.

13 Claims, 3 Drawing Sheets

← 10 GAUSS

- - - - - BEFORE X-RAY IRRADIATION
———— AFTER X-RAY IRRADIATION

X-RAY MASK AND METHOD FOR PRODUCING SAME

BACKGROUND OF THE INVENTION

(1) Field of the Invention

The present invention relates to a semiconductor lithography technique and particular to an X-ray mask suitable for lithography using a soft X-ray and a method for producing it.

(2) Prior Art

Silicon nitride having a stoichiometric atomic composition, namely, $SiN_{1.33}$, has an internal tensile stress as large as about $2 \times 10^9$ N/m$^2$ and, when a membrane is produced therefrom by deposition and if the thickness exceeds a certain value, the breaking strength is exceeded causing cracks and thus it is not preferred to produce $SiN_{1.33}$ membranes. Therefore, the membrane of silicon nitride SiNx which is a material capable of transmitting a soft X-ray as an X-ray mask substrate material has been prepared by adjusting an $NH_3/SiH_4$ ratio of reaction gas in the chemical vapor deposition in order to reduce the internal stress as disclosed in Japanese Patent Kokai No. 54-53965. The thus prepared membrane of silicon nitride SiNx had a desired atomic composition and a reduced internal tensile stress and thus the effective tensile strength of the silicon nitride SiNx membranes per se was increased. Such silicon nitride SiNx has been used as an X-ray mask substrate material.

Since generally X-ray lithography is a system for positioning an X-ray transmission type mask close to a silicon wafer or the like and transferring a mask pattern in a ratio of 1:1, a high dimensional precision is required for the X-ray mask per se. An X-ray mask comprises a mask substrate composed of a thin membrane of a light element material which can easily transmit a soft X-ray and a pattern of a heavy metal capable of absorbing soft X-ray and visible beam, formed thereon. In order to obtain a good X-ray transmissivity, the thickness of the mask substrate must be about several $\mu$m. In an a X-ray mask having such a membrane structure, the mask substrate is required to have a proper tensile strength and a flatness for ensuring a mask pattern arrangement with a high precision and furthermore it is required for the mask substrate that there occurs neither an increase in temperature due to X-ray exposure nor a positional distortion due to deterioration of the material. Moreover, in the system for positioning the X-ray transmission type mask close to a silicon wafer or the like and transferring a mask pattern, the mask substrate must have a high visible beam transmissivity when the transmission is carried out with a visible beam such as a laser beam for highly accurate positioning of the X-ray mask and a material on which the mask pattern is to be transferred.

However, according to the above prior art (Japanese Patent Kokai No. 53-95965), a mask substrate comprising a thin membrane of light element material has been produced by forming a membrane from silicon nitride SiNx having a desired atomic composition only by reducing the internal tensile stress by changing the $NH_3/SiH_4$ ratio of a reactant gas in the chemical vapor deposition to increase the effective tensile strength of the membrane per se. However, the X-ray mask comprising such a mask substrate has suffered from the problem that positional distortion occurs due to material deteriorations induced by radiation damage from X-ray exposure as disclosed in "The 1st Microprocess Conference (1988), pages 80-81".

SUMMARY OF THE INVENTION

An object of the present invention is to provide an X-ray mask of high quality capable of ensuring a mask pattern arrangement with a high precision by suppressing the occurrence of positional distortions due to material deteriorations induced by radiation damage from X-ray exposure, and a method for producing the X-ray mask.

With reference to the radiation stability of a SiNx membrane, positional distortions occur due to damages by radiation as mentioned in the above-mentioned prior art reference. The present inventors have taken into account that the radiation stability of an SiN membrane is ascribed to the SiN membrane quality, especially composition.

First, the present inventors investigated SiN compositions in various ratios of Si and N as a parameter and found that positional distortions due to radiation damage occurred in all the investigated samples. When the SiN compositions were further investigated in detail by XPS (X-ray photoelectron spectroscopy), the present inventors found that all the investigated samples contained oxygen in atomic ratios of oxygen to silicon of at least 0.01. This is because oxygen readily contaminates the SiN membrane as an impurity as disclosed in J. Electron. Soc. vol. 123 (1976), pages 723-728. Then, the present inventors prepared SiN membranes while making the oxygen content as small as possible during the formation of the SiN membranes and investigated their radiation stability and found that none of the investigated samples showed positional distortions due to radiation exposure damage, so long as the samples had an appropriate tensile strength ($3.0 \times 10^8$ N/m$^2$ or less), an appropriate composition ratio (N/Si ratio = 0.6-0.8), and an oxygen content in an atomic ratio of oxygen to silicon of more than 0 but not more than 0.01.

The object of the present invention can be attained by reducing an amount of impurities contained in the mask substrate material, especially silicon based mask substrate material.

Especially, the object of the present invention can be most effectively attained by suppressing the oxygen content in the silicon-based mask substrate material, for example, by restricting the oxygen content in a silicon nitride membrane to an atomic ratio of oxygen to silicon of more than 0 but not more than 0.01 ($SiNxOy$: $0 < y \leq 0.01$).

The term "silicon nitride membrane" used here means a membrane represented by $SiNxOy$ where "y" indicates an oxygen content in an atomic ratio of O/Si as an impurity content.

According to the present invention, an X-ray mask of high quality can be provided that does not exhibit positional distortions due to material deterioration induced by radiation damage of the membrane by X-ray exposure by restricting the oxygen content in the silicon nitride membrane to an atomic ratio of oxygen to silicon of more than 0 but not more than 0.01 ($SiNxOy$: $0 < y$ 23 0.01).

DETAILED EXPLANATION OF THE INVENTION

The advantageous effects obtained by suppressing the oxygen content in the silicon nitride $SiNxOy$ membrane to more than 0 but not more than 0.01 in the atomic ratio of oxygen to silicon will be explained. Occurrence of positional distortions due to material deteriorations of the X-ray mask substrate by X-ray exposure means occurrence of radiation damage in the mask substrate. Upon examination of causes for radiation damage in a mask substrate of silicon nitride, it has been found that the presence of oxygen which is liable to enter an impurity into the silicon nitride membrane is an essential or primary cause.

The oxygen contained as an impurity in the silicon nitride membrane forms chemical bonds with silicon atoms in the membrane (hereinafter referred to as "Si—O bonds"). The Si—O bonds more easily produce so-called dangling bonds owing to their breakage by exposure to radiation beams such as X-ray beam than the bonds of silicon atoms and nitrogen atoms (hereinafter referred to as "Si—N bond") which are present much more in the SiNx membrane. When such bond breakage occurs, distortions are brought about in the lattices in the silicon nitride membrane, resulting in occurrence of positional distortions due to material deterioration.

On the other hand, since Si—N bonds undergo substantially no bond breakage by exposure to radiation beams, am X-ray mask of high quality which is not affected by the breakage of the Si—O bonds and shows no occurrence of positional distortions due to material deterioration by X-ray exposure can be provided by restricting the oxygen content as an impurity in the silicon nitride membrane to an atomic ratio of oxygen to silicon of more than 0 but not more than 0.01 (SiNxOy: $0 < y \leq 0.01$).

The foregoing explanation has been made with respect to the occurrence of oxygen contained as an impurity in a silicon nitride membrane. On the other hand, a similar phenomenon to that of oxygen contained in the silicon nitride membrane as an impurity appears, resulting in occurrence of positional distortions due to material deterioration, when materials of light elements such as Si, Al, B, C, Be, etc. of up to the third row in the periodic table, for example, silicon-based materials such as silicon carbide material and aluminum-based materials such as aluminum nitride material as mask substrates, which generally contain impurities, are exposed to radiation for a long time.

Therefore, it is essential to reduce contents of impurities in mask substrate materials in order to obtain an X-ray mask of high quality which undergoes no positional distortion caused by material deterioration from X-ray radiation.

PREFERRED EMBODIMENTS OF THE INVENTION

EXAMPLE 1

Figure 1A:
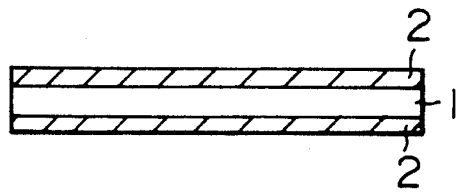
FIGS. 1A to 1F show cross-sectional views of the X-ray mask of the present invention and steps for making the mask.

FIGS. 1A to 1F shown the cross-sectional structure of the X-ray mask according to the present invention and steps for its production thereof. First, on both sides of a 3-inch silicon wafer 1 (100), 1 mm thick, which was previously subjected to a nitric acid boiling treatment, were deposited silicon nitride membranes 2 to a thickness of 2 μm by low pressure chemical vapor deposition (FIG. 1A). For this case, the ultimate vacuum degree in the reaction chamber was $1 \times 10^3$ Torr or less. Furthermore, flow rates of dichlorosilane (SiH$_2$Cl$_2$) and ammonia (NH$_3$) as raw material gases were 200 sccm and 50 sccm, respectively (flow rate ratio SiCl$_2$H$_2$/NH$_3$ was preferably 1 to 6) and reaction temperature was 880° C. (preferable reaction temperature was between 800 and 950° C.). Further, the tensile strength of the silicon nitride membrane was $1.2 \times 10^8$ N/m$^2$ (preferable tensile strength was $3.0 \times 10^8$ N/m$^2$ or less) and atomic ratio x of N/Si of the silicon nitride (SiNxOy) membrane was 0.67 (x was preferably 0.6–0.8) and the oxygen content y was found to be $0 < y \leq 0.01$.

Figure 1B:
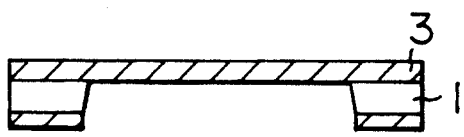

Then, the silicon nitride membrane 2 on one side of the sample was removed in the form of a circle of 20 mm in radius from the center of the sample, and the silicon wafer 1 was subjected to back etching to form a supporting substrate 3 for the silicon nitride membrane 2 as shown in FIG. 1B. At that time, visible beam transmissivity of silicon nitride 2 was 75% at a wavelength of 633 nm.

Figure 1C:
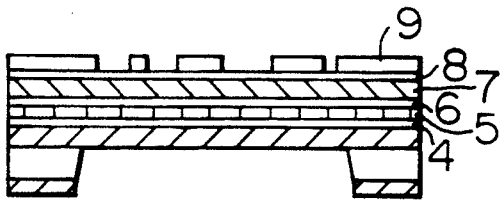

Then, on the surface of supporting substrate 3 for the silicon nitride membrane 2 were deposited a Mo layer 4, an Au layer 5 and a Ti layer 6 to a thickness of 0.02 μm, 0.1 μm, and 0.02 μm, respectively, by electron beam vapor deposition and thereafter a PIQ (polyimide resin made by Hitachi Chemical Co., Ltd.) layer 7 was applied thereto to a thickness of 1.2 μm, followed by baking at 200° C. for 20 minutes and then at 350° C. for 30 minutes. Then, an OAP layer 8 (=Si layer; OAP is a trademark of a product made by Tokyo Ohka K. K., Japan) was applied thereto and subsequently an electron ray resist layer 9 of SAL 601 ER 7 (made by Shipley Co., Ltd.) was applied thereto to a thickness of 0.5 μm, following by prebaking at 80° C. for 10 minutes. A given circuit pattern was drawn by an electron beam (30 kV, exposure dosage: 10 μC/mc$^2$) and then the sample was baked at 110° C. for 10 minutes and then developed. (FIG. 1C).

Figure 1D:
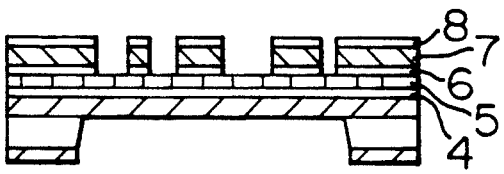

Then, the Si layer 8, PIQ layer 7 and Ti layer 6 were subjected to dry etching by reactive ion etching with the resist pattern 9 as a mask. The reaction gases used for the reaction ion etching of the individual layers were CF$_4$ +O$_2$ (4%), O$_2$, CF$_4$ +O$_2$ (4%), respectively. (FIG. 1D).

Figure 1E:
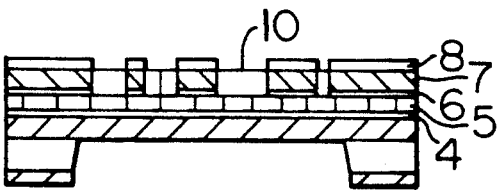

Then, an Au pattern 10 was deposited to a thickness of 0.7 μm on the pattern of the PIQ layer 7 by a pulse plating method and thereafter subjected to an annealing treatment at 100° C. for 1 hour. (FIG. 1E).

Figure 1F:
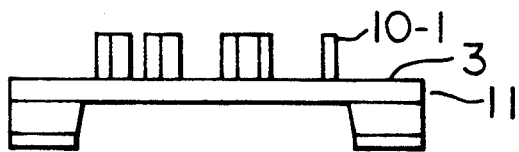

Then, the Si layer 8, PIQ layer 7, Ti layer 6 and Au/Mo layer 5/4 were removed by dry etching, thereby obtaining an X-ray mask 11 comprising the Au pattern 10-1 having a desired circuit and the supporting substrate 3 of the silicon nitride membrane. (FIG. 1F).

The X-ray mask 11 produced in Example 1 was exposed to an X-ray beam in $10^5$ exposure shots (one shot = 50 mJ/cm$^2$) to conduct a test for examining the radiation resistance. It was found that no positional distortions larger than that of the measurement accuracy (3σ: <0.03 μm) occurred.

Example 2

Silicon nitride (SiNxOy) membranes (Sample Nos. 1 to 9) were prepared under various membrane forming conditions and X-ray masks were produced therefrom in the same manner as in Example 1 and subjected to the radiation resistance test as in Example 1. It was found that no positional distortions larger than that of the measurement accuracy ($3\sigma$: <0.03 μm) occurred in the samples where the atomic ratio x of N/Si of the silicon nitride membranes was $0.6 \leq x \leq 0.8$, and oxygen content y of O/Si of the silicon nitride membranes was $0 < y \leq 0.01$. On the other hand, positional distortions occurred in the samples where the oxygen content y was $\geq 0.02$ (SiNxOy: $y \geq 0.02$). With increasing oxygen content, larger positional distortion occurred. The results are shown in the following Table together with other characteristics.

TABLE

Conditions for production of SiNx membranes, and positional distortions induced by X-ray radiation together with other characteristics

| Sample No. | Gas flow rate (SCCM) SiH$_2$Cl$_2$ | NH$_3$ | NO$_2$ | Ultimate vacuum degree (Torr) | Reaction temperature | Atomic composition SiNxOy Si | N | O |
|---|---|---|---|---|---|---|---|---|
| 1 | 400 | 100 | 0 | $<1 \times 10^{-3}$ | 880° C. | 1.0 | x = 0.70 | $0 < y \leq 0.01$ |
| 2 | 30 | 15 | 0 | $<1 \times 10^{-3}$ | 880° C. | 1.0 | x = 0.68 | $0 < y \leq 0.01$ |
| 3 | 30 | 20 | 0 | $<1 \times 10^{-3}$ | 880° C. | 1.0 | x = 0.62 | $0 < y \leq 0.01$ |
| 4 | 30 | 30 | 0 | $<1 \times 10^{-3}$ | 950° C. | 1.0 | x = 0.76 | $0 < y \leq 0.01$ |
| 5 | 30 | 13 | 0 | $<1 \times 10^{-3}$ | 840° C. | 1.0 | x = 0.65 | $0 < y \leq 0.01$ |
| 6 | 180 | 50 | 0 | $<1 \times 10^{-3}$ | 880° C. | 1.0 | x = 0.68 | $0 < y \leq 0.01$ |
| 7 | 200 | 50 | 0 | $7 \times 10^{-2}$ | 880° C. | 1.0 | x = 0.70 | y = 0.02 |
| 8 | 180 | 50 | 5 | $<1 \times 10^{-3}$ | 880° C. | 1.0 | x = 0.70 | y = 0.04 |
| 9 | 300 | 35 | 15 | $<1 \times 10^{-3}$ | 880° C. | 1.0 | x = 0.58 | y = 0.13 |

| Sample No. | Tensile strength (N/m$^2$) | Positional distortion generated after X-ray irradiation $3\sigma$ | Visible beam transmissivity (thickness of SiN membrane 2 μm; wavelength 633 nm) | Flatness on 3-inch water |
|---|---|---|---|---|
| 1 | $1.9 \times 10^8$ | <0.03 μm | 75% | 0.1 μm |
| 2 | $1.6 \times 10^8$ | <0.03 μm | 75% | 0.1 μm |
| 3 | $0.3 \times 10^8$ | <0.03 μm | 70% | 0.1 μm |
| 4 | $2.3 \times 10^8$ | <0.03 μm | 80% | 0.1 μm |
| 5 | $0.5 \times 10^8$ | <0.03 μm | 70% | 0.1 μm |
| 6 | $1.2 \times 10^8$ | <0.03 μm | 75% | 0.1 μm |
| 7 | $1.9 \times 10^8$ | 0.3 μm | 75% | 0.1 μm |
| 8 | $1.9 \times 10^8$ | 0.6 μm | 75% | 0.1 μm |
| 9 | $2.5 \times 10^8$ | 2.7 μm | 75% | 0.1 μm |

Figure 2A:
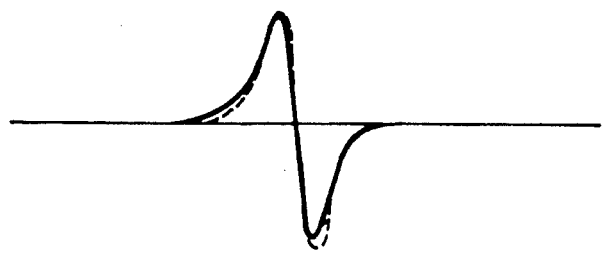
FIG. 2A, 2B and 3 show ESR spectra a relationship between the positional distortion and the exposure shot number, respectively.
Figure 2B:
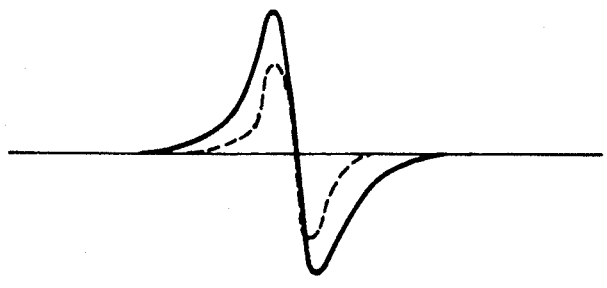

Among the silicon nitride (SiNxOy) membranes produced in Example 2, the electron spin resonance (ESR) spectrum of the sample where the oxygen content was $0 < y \leq 0.01$ (Sample No. 1) and the sample where the oxygen content was y = 0.02 (Sample No. 7) was observed before and after the X-ray irradiation with an exposure run number of $10^5$ and the changes in the number of dangling bonds (unpaired electrons) of the SiNxOy membranes before and after the x-ray irradiation was examined (FIGS. 2A and 2B). Sample No. 1 of oxygen content $0 < y \leq 0.01$ had no change in the spectrum before and after the X-ray irradiation and the number of dangling bonds did not increase (FIG. 2A). On the other hand, Sample No. 7 of oxygen content y = 0.02 had a change in the shape of the spectrum and furthermore new dangling bonds were produced (FIG. 2B). The new dangling bonds were found to be a cause for the occurrence of positional distortions.

Among the silicon nitride (SiNxOy) membranes produced in Example 2, the sample having an oxygen content of $0 < y \leq 0.01$ (Sample No. 1) was exposed to an X-ray beam and the occurrence of positional distortions was examined by changing the exposure shot number.

Figure 3:
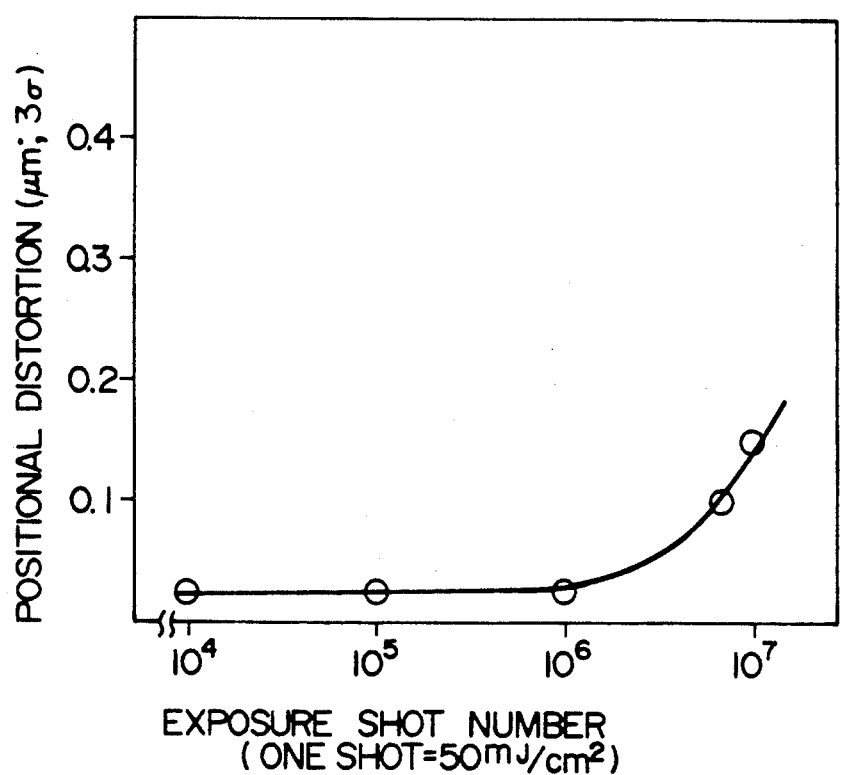

In Sample No. 1 of oxygen content $0 < y \leq 0.01$, no positional distortion larger than the measurement accuracy occurred after irradiation with X-rays with an exposure shot number of 1,000,000 and a positional distortion of 0.1 μm occurred after the irradiation with X-rays with an exposure shot number of 7,000,000 as shown in FIG. 3.

Furthermore, semiconductor devices were made by bringing the X-ray masks produced in Examples 1 and 2 close to a silicon wafer coated with a resist and by irradiating them with soft X-ray to transfer the mask pattern in a 1:1 ratio. As a result, it was found that mask patterns of high precision could be transferred for a long period of time.

According to the present invention, it is possible to provide an X-ray mask of high quality with a high tensile strength and flatness, capable of assuring an arrangement of a mask pattern with a high precision, without positional distortions due to material deterioration by X-ray exposure, and with a sufficiently high visible beam transmissivity for positioning the X-ray mask and a material on which the mask pattern is to be transferred with a high precision. Thus, the present invention provides highly advantageous effects for realization of an X-ray lithography process with a good economical efficiency. The present X-ray mask can be efficiently applied to the making of semiconductor devices.

What is claimed is:

1. An X-ray mask which comprises an absorber pattern composed of a material capable of absorbing X-rays, a mask substrate for supporting the absorber pattern, composed of a material capable of transmitting an X-ray, and a support frame for supporting the mask substrate, said mask substrate being composed of a mask substrate material having an impurity content suppressed to reduce positional distortions by X-ray irradiation and being composed of silicon nitride represented by SiNx, where X is 0.6 to 0.8.

2. An X-ray mask which comprises an absorber pattern composed of a material capable of absorbing X-rays, a mask substrate for supporting the absorber pattern, composed of a material capable of transmitting an X-ray, and a support frame for supporting the mask substrate, said mask substrate being composed of a mask substrate material having an impurity content suppressed to reduce positional distortions by X-ray irradiation, wherein the impurity contained in the mask substrate material is oxygen having a content of more than 0 but not more than 0.01 in an atomic ratio of oxygen to silicon.

3. An X-ray mask which comprises an absorber pattern composed of a material capable of absorbing X-rays, a mask substrate for supporting the absorber pattern, composed of a material capable of transmitting an X-ray, and a support frame for supporting the mask substrate, the mask substrate being composed of a mask substrate material having an impurity content suppressed so that positional distortions generated when the mask substrate is exposed to X-ray radiation with exposure shots of $10^5$ is within 0.03 μm and wherein the mask substrate is composed of silicone nitride represented by SiNx, where X is 0.6 to 0.8.

4. An X-ray mask which comprises an absorber pattern composed of a material capable of absorbing X-rays, a mask substrate for supporting the absorber pattern, composed of a material capable of transmitting an X-ray, and a support frame for supporting the mask substrate, the mask substrate being composed of a mask substrate material having an impurity content suppressed so that positional distortions generated when the mask substrate is exposed to X-ray radiation with exposure shots of $10^5$ is within 0.03 μm and wherein the impurity contained in the mask substrate material is oxygen having a content of more than 0 but not more than 0.01 in an atomic ratio of oxygen to silicon.

5. An X-ray mask which comprises an absorber pattern composed of a material capable of absorbing X-rays, a mask substrate for supporting the absorber pattern, composed of a material capable of transmitting an X-ray, and a support frame for supporting the mask substrate, said mask substrate being composed of a mask substrate material having an impurity content suppressed to reduce positional distortions by X-ray irradiation and being composed of silicon nitride represented by SiNx, where X is 0.6 to 0.8 and wherein the impurity contained in the mask substrate material is oxygen.

6. An X-ray mask which comprises an absorber pattern composed of a material capable of absorbing X-rays, a mask substrate for supporting the absorber pattern, composed of a material capable of transmitting an X-ray, and a support frame for supporting the mask substrate, said mask substrate being composed of a mask substrate material having an impurity content suppressed to reduce positional distortions by X-ray irradiation, wherein the mask substrate is composed of a light element material and the impurity contained in the mask substrate material is oxygen having a content of more than 0 but not more than 0.01 in an atomic ratio of oxygen to silicon.

7. An X-ray mask which comprises an absorber pattern composed of a material capable of absorbing X-rays, a mask substrate for supporting the absorber pattern, composed of a material capable of transmitting an X-ray, and a support frame for supporting the mask substrate, said mask substrate being composed of a mask substrate material having an impurity content suppressed to reduce positional distortions by X-ray irradiation and being selected from the elements of up to the third row of the periodic table and wherein the impurity contained in the mask substrate material is oxygen having a content of more than 0 but not more than 0.01 in an atomic ratio of oxygen to silicon.

8. An X-ray mask which comprises an absorber pattern composed of a material capable of absorbing X-rays, a mask substrate for supporting the absorber pattern, composed of a material capable of transmitting an X-ray, and a support frame for supporting the mask substrate, said mask substrate being composed of a mask substrate material having an impurity content suppressed to reduce positional distortions by X-ray irradiation, wherein the mask substrate is composed of a silicon material or an aluminum material and wherein the impurity contained in the mask substrate material is oxygen having a content of more than 0 but not more than 0.01 in an atomic ratio of oxygen to silicon.

9. An X-ray mask which comprises an absorber pattern composed of a material capable of absorbing X-rays, a mask substrate for supporting the absorber pattern, composed of a material capable of transmitting an X-ray, and a support frame for supporting the mask substrate, said mask substrate being composed of a mask substrate material having an impurity content suppressed to reduce positional distortions by X-ray irradiation, wherein the mask substrate is composed of a silicone nitride represented by SiNx and wherein the impurity contained in the mask substrate material is oxygen having a content of more than 0 but not more than 0.01 in an atomic ratio of oxygen.

10. An X-ray mask according to claim 1, wherein the impurity contained in the mask substrate material is oxygen having a content more than 0 but not more than 0.01 in an atomic ratio of oxygen to silicon.

11. An X-ray mask which comprises an absorber pattern composed of a material capable of absorbing X-rays, a mask substrate for supporting the absorber pattern, composed of a material capable of transmitting an X-ray, and a support frame for supporting the mask substrate, said mask substrate being composed of a mask substrate material having an impurity content suppressed to reduce positional distortions by X-ray irradiation, wherein the mask substrate is composed of silicone nitride represented by SiNx having a tensile strength of $3.0 \times 10^8$ N/m² or less and wherein the impurity contained in the mask substrate material is oxygen having a content of more than 0 but not more than 0.01 in an atomic ratio of oxygen to silicon.

12. An X-ray mask according to claim 3, wherein the impurity contained in the mask substrate material is oxygen.

13. An X-ray mask according to claim 3, wherein the impurity contained in the mask substrate material is oxygen having a content more than 0 but not more than 0.01 in an atomic ratio of oxygen to silicon.

* * * * *